(12) United States Patent
Chou et al.

(10) Patent No.: US 9,691,750 B2
(45) Date of Patent: Jun. 27, 2017

(54) SEMICONDUCTOR DEVICE AND LAYOUT METHOD THEREOF

(71) Applicant: TAIWAN SEMICONDUCTOR MANUFACTURING COMPANY LTD., Hsinchu (TW)

(72) Inventors: Ting-Wei Chou, Taichung (TW); Wen-Lang Wu, Taichung (TW); Chitong Chen, Taipei (TW); Shun Li Chen, Tainan (TW); Ting-Wei Chiang, New Taipei (TW); Li-Chun Tien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 121 days.

(21) Appl. No.: 14/610,088

(22) Filed: Jan. 30, 2015

(65) Prior Publication Data

US 2016/0225752 A1    Aug. 4, 2016

(51) Int. Cl.
G06F 17/50 (2006.01)
H01L 27/02 (2006.01)
H01L 27/092 (2006.01)
H01L 27/088 (2006.01)
H01L 23/60 (2006.01)

(52) U.S. Cl.
CPC ...... *H01L 27/0207* (2013.01); *G06F 17/5072* (2013.01); *H01L 27/092* (2013.01); *H01L 23/60* (2013.01); *H01L 27/0259* (2013.01); *H01L 27/088* (2013.01); *H01L 2924/00* (2013.01); *H01L 2924/0002* (2013.01)

(58) Field of Classification Search
CPC ......... G06F 17/5072; H01L 2924/0002; H01L 2924/00; H01L 23/60; H01L 27/0259; H01L 27/0207
See application file for complete search history.

(56) References Cited

U.S. PATENT DOCUMENTS

| | | | | | |
|---|---|---|---|---|---|
| 4,903,095 | A | * | 2/1990 | Chapron | H01L 29/861 257/510 |
| 5,420,447 | A | * | 5/1995 | Waggoner | H01L 27/11807 257/202 |
| 5,742,078 | A | * | 4/1998 | Lee | H01L 27/1104 257/202 |
| 5,812,443 | A | * | 9/1998 | Lee | H01L 27/10808 257/296 |
| RE36,440 | E | * | 12/1999 | Lee | H01L 27/1104 257/202 |
| 6,103,579 | A | * | 8/2000 | Violette | H01L 21/76202 257/E21.552 |
| 6,377,499 | B1 | * | 4/2002 | Tobita | G11C 11/405 257/E27.084 |

(Continued)

*Primary Examiner* — Helen Rossoshek
(74) *Attorney, Agent, or Firm* — WPAT, P.C., Intellectual Property Attorneys; Anthony King

(57) ABSTRACT

In some embodiments, a semiconductor device comprises a first active region, a second active region, and a conductive metal structure. The second active region is separate from the first active region. The conductive metal structure is arranged to connect the first active region and the second active region. The conductive metal structure includes a first leg, a second leg and a body. The second leg is separate from the first leg and a body extending between and connecting the first leg and the second leg.

20 Claims, 18 Drawing Sheets

(56) References Cited

U.S. PATENT DOCUMENTS

| | | | | |
|---|---|---|---|---|
| 6,420,769 B2* | 7/2002 | Patelmo | H01L 21/823418 | 257/500 |
| 7,107,562 B2* | 9/2006 | Schroder | H01L 27/0207 | 716/122 |
| 7,302,660 B2* | 11/2007 | Shimamura | G06F 17/5072 | 257/206 |
| 8,947,841 B2* | 2/2015 | Salcedo | | 361/111 |
| 9,041,117 B2* | 5/2015 | Liaw | G11C 11/412 | 257/225 |
| 9,287,282 B2* | 3/2016 | Hsieh | H01L 27/11524 | |
| 2003/0201494 A1* | 10/2003 | Maeda | H01L 21/84 | 257/347 |
| 2007/0111409 A1* | 5/2007 | Watanabe | H01L 21/84 | 438/152 |
| 2008/0217675 A1* | 9/2008 | Liu | H01L 21/28273 | 257/321 |
| 2008/0265361 A1* | 10/2008 | Krauss | H01L 27/0207 | 257/503 |
| 2009/0315095 A1* | 12/2009 | Kim | H01L 21/8221 | 257/314 |
| 2011/0103166 A1* | 5/2011 | Min | G11C 5/025 | 365/205 |
| 2011/0165746 A1* | 7/2011 | Liu | H01L 21/28273 | 438/264 |
| 2011/0210713 A1* | 9/2011 | Kazama | H02M 3/1588 | 323/311 |
| 2012/0042296 A1* | 2/2012 | Baumgartner | H01L 29/4238 | 716/119 |
| 2012/0306025 A1* | 12/2012 | Becker | H01L 27/0207 | 257/401 |
| 2013/0208385 A1* | 8/2013 | Salcedo | H01L 23/60 | 361/111 |
| 2013/0270629 A1* | 10/2013 | Ikebuchi | H01L 27/088 | 257/329 |
| 2014/0282326 A1* | 9/2014 | Chen | G06F 17/5081 | 716/111 |
| 2015/0205897 A1* | 7/2015 | Kang | G06F 17/5045 | 716/102 |
| 2015/0214237 A1* | 7/2015 | Hsieh | H01L 27/11524 | 257/316 |

* cited by examiner

SEMICONDUCTOR DEVICE AND LAYOUT METHOD THEREOF

BACKGROUND

Inverters are widely used in various circuits. An inverter functions to convert a logic high state to a logic low state, and vice versa. Generally, in the layout design for an inverter, a metal-1 (M1) layer is used to connect individual source terminals of an NMOS transistor and a PMOS transistor while a metal-2 (M2) layer is used to connect individual drain terminals of the NMOS transistor and the PMOS transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
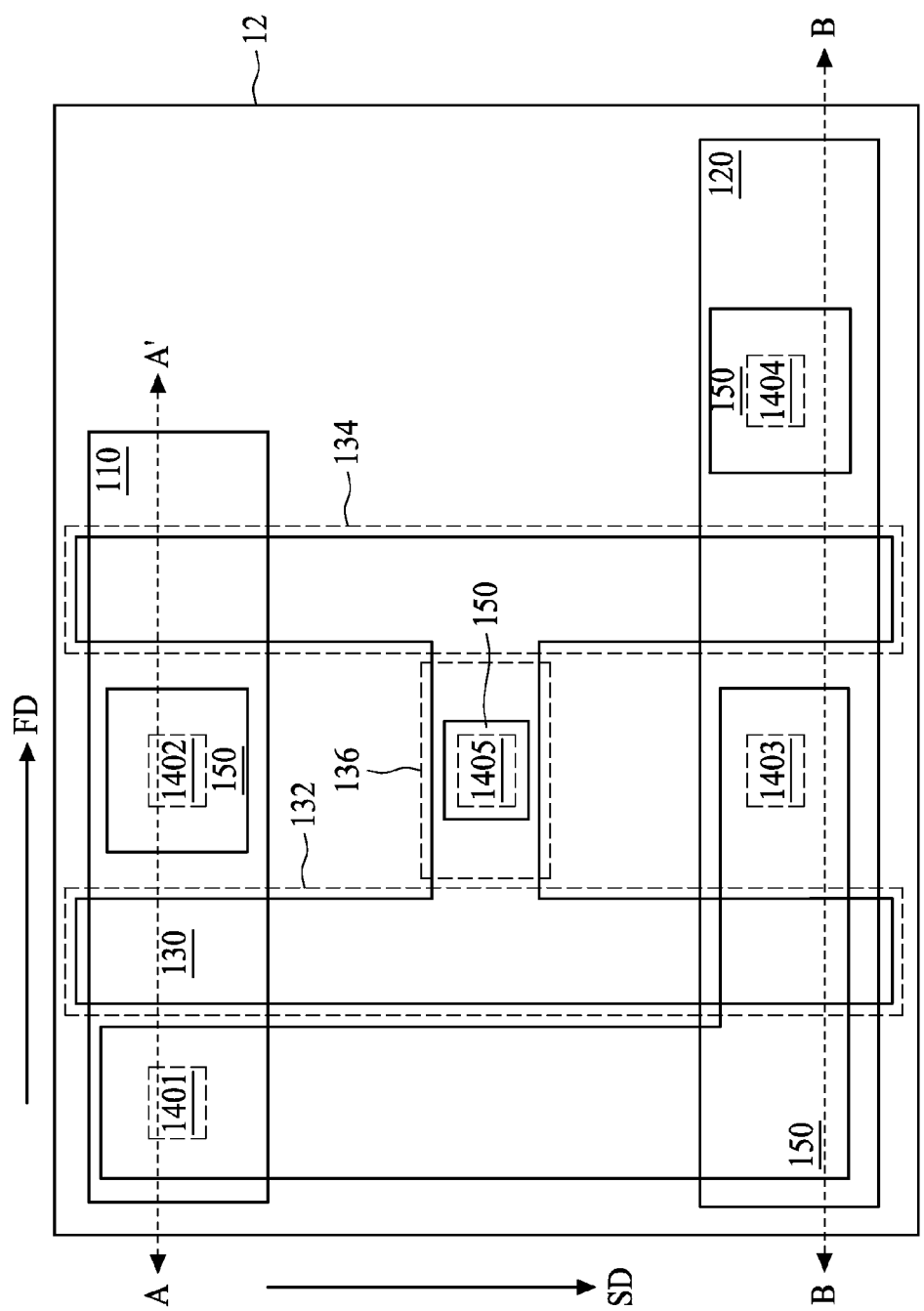
FIG. 1A is a schematic layout view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term one or the of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing.

FIG. 1A is a schematic layout view of a semiconductor device 10, in accordance with some embodiments. Referring to FIG. 1A, the semiconductor device 10 includes a substrate 12 and a poly structure 130. The substrate 12 includes a first active region 110 and a second active region 120. The poly structure 130 is formed on the substrate 12, and connects the first active region 110 and the second region 120. In this embodiment, the first active region 110 and the second active region 120 substantially extend in a first direction FD.

The poly structure 130 includes a first leg 132, a second leg 134 and a body 136. The first leg 132 connects the first active region 110 and the second active region 120, and substantially extends in a second direction SD. In an embodiment, the second direction SD is perpendicular to the first direction FD. The second leg 134 also connects the first active region 110 and the second active region 120, and substantially extends in the second direction SD. The body 136 substantially extends in the first direction FD, and connects the first leg 132 and the second leg 134. Although throughout the specification an exemplary poly structure is used for the semiconductor device, in some embodiments, however, the semiconductor device 10 includes a conductive metal structure that functions to serve as the poly structure. For example, the conductive metal includes titanium nitride (TiN).

The semiconductor device 10 further includes contacts for interconnection. In the present embodiment, a first contact 1401 and a second contact 1402 are used to electrically connect the first active region 110 and a patterned conductive layer 150, for example, a metal-1 layer. Moreover, a third contact 1403 and a fourth contact 1404 are used to electrically connect the second active region 120 and the metal-1 layer 150. Furthermore, a fifth contact 1405 is used to electrically connect the poly structure 130 and the metal-1 layer 150.

The layout method as illustrated and described with reference to FIG. 1A can be widely applied to circuits using inverters, such as an analog-to-digital converter (ADC), a digital-to-analog converter (DAC) and a multiplexer.

Figure 1B:
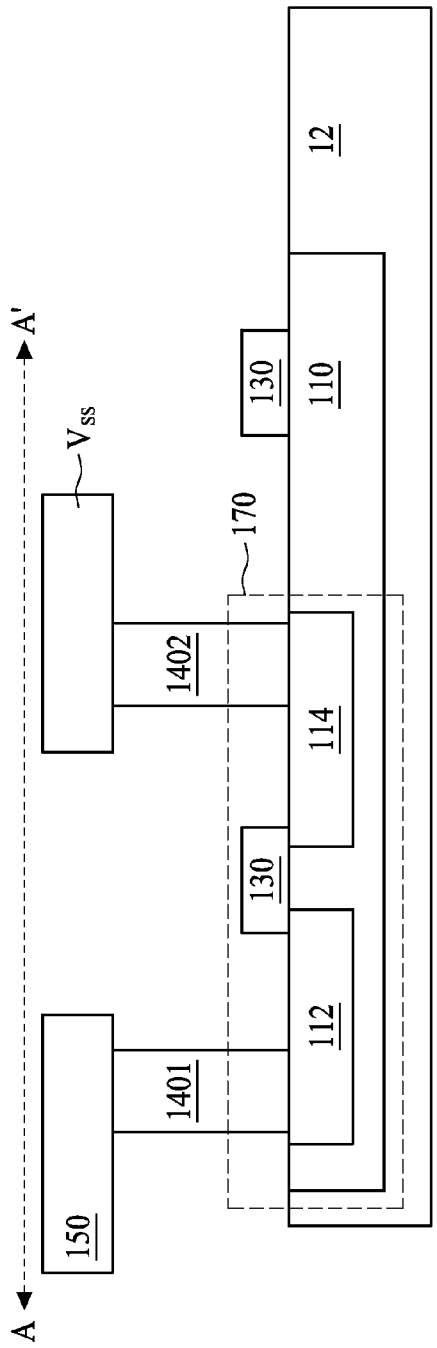
FIG. 1B is a cross-sectional view of the semiconductor device shown in FIG. 1A taken along a line A-A', in accordance with some embodiments.

FIG. 1B is a cross-sectional diagram of the semiconductor device 10 shown in FIG. 1A taken along a line A-A', in accordance with some embodiments. Referring to FIG. 1B, the first active region 110 includes a first n-type region 112 and a second n-type region 114. The first n-type region 112, the second n-type region 114 and the poly structure 130 serve as an N-type metal-oxide-semiconductor (NMOS) transistor 170. The first n-type region 112 serves as a drain terminal of the NMOS transistor 170, and is coupled to the metal-1 layer 150 via the first contact 1401. The second n-type region 114 serves as a source terminal of the NMOS transistor 170, and is coupled to the metal-1 layer 150 via the second contact 1402 to receive a reference voltage $V_{SS}$, such as a ground voltage. The poly structure 130 serves as a gate terminal of the NMOS transistor 170.

Figure 1C:
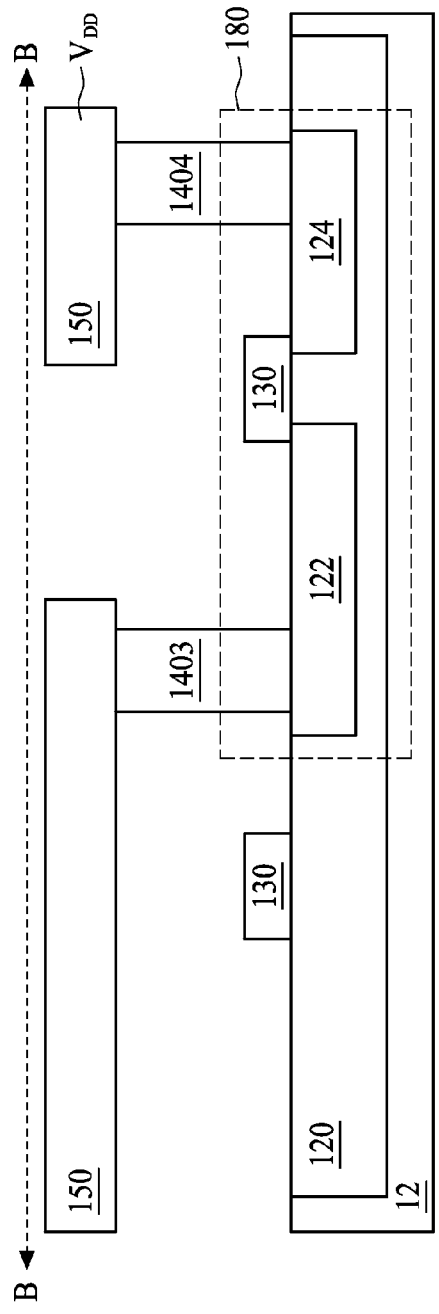
FIG. 1C is a cross-sectional view of the semiconductor device shown in FIG. 1A taken along a line B-B', in accordance with some embodiments.

FIG. 1C is a cross-sectional view of the semiconductor device 10 shown in FIG. 1A taken along a line B-B', in accordance with some embodiments. The second active region 120 includes a first p-type region 122 and a second p-type region 124. The first p-type region 122, the second p-type region 124 and the poly structure 130 serve as a P-type metal-oxide-semiconductor (PMOS) transistor 180.

The first p-type region 122 serves as a drain terminal of the PMOS transistor 180, and is coupled to the metal-1 layer 150 via the third contact 1403. Referring back to FIG. 1A, the third contact 1403, the metal-1 layer 150 and the first contact 1401 are used to couple the NMOS transistor 170 and the PMOS transistor 180, such that, referring to FIG. 1C, the drain terminals of the NMOS transistor 170 and the PMOS transistor 180 are coupled to each other.

The second p-type region 124 serves as a source terminal of the PMOS transistor 180, and is coupled to the metal-1 layer 150 via the fourth contact 1404 to receive a supply voltage $V_{DD}$.

The poly structure 130 serves as a gate terminal of the PMOS transistor 180. As a result, the poly structure 130 serves as a common gate of the NMOS transistor 170 and the PMOS 180.

As shown in FIGS. 1A, 1B and 1C, no metal-2 layer is used to connect the NMOS transistor 170 and the PMOS transistor 180. Such layout method can eliminate the need for a metal mask in the inverter area. Moreover, the metal-2 layer process window can be enlarged, which will be described in detail with reference to FIG. 2.

Figure 1D:
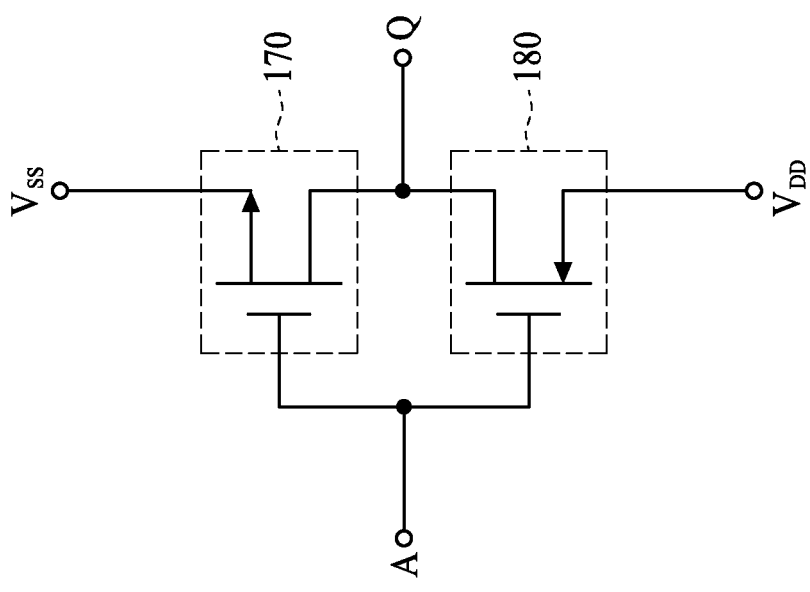
FIG. 1D is circuit diagram of an equivalent circuit of the semiconductor device shown in FIG. 1A, in accordance with some embodiments.

FIG. 1D is a circuit diagram of an equivalent circuit 15 of the semiconductor device 10, in accordance with some embodiments. Referring to FIG. 1D, the equivalent circuit 15 includes the NMOS transistor 170 and the PMOS transistor 180. The source terminal of the NMOS 170 is coupled to the reference voltage $V_{SS}$. The gate terminals of the NMOS transistor 170 and the PMOS transistor 180 are coupled together at a node A. The drain terminals of the NMOS transistor 170 and the PMOS transistor 180 are coupled together at a node Q. The source terminal of the PMOS 180 is coupled to the supply voltage $V_{SS}$. In this embodiment, the NMOS transistor 170 and the PMOS transistor 180 serve as an inverter.

Figure 2:
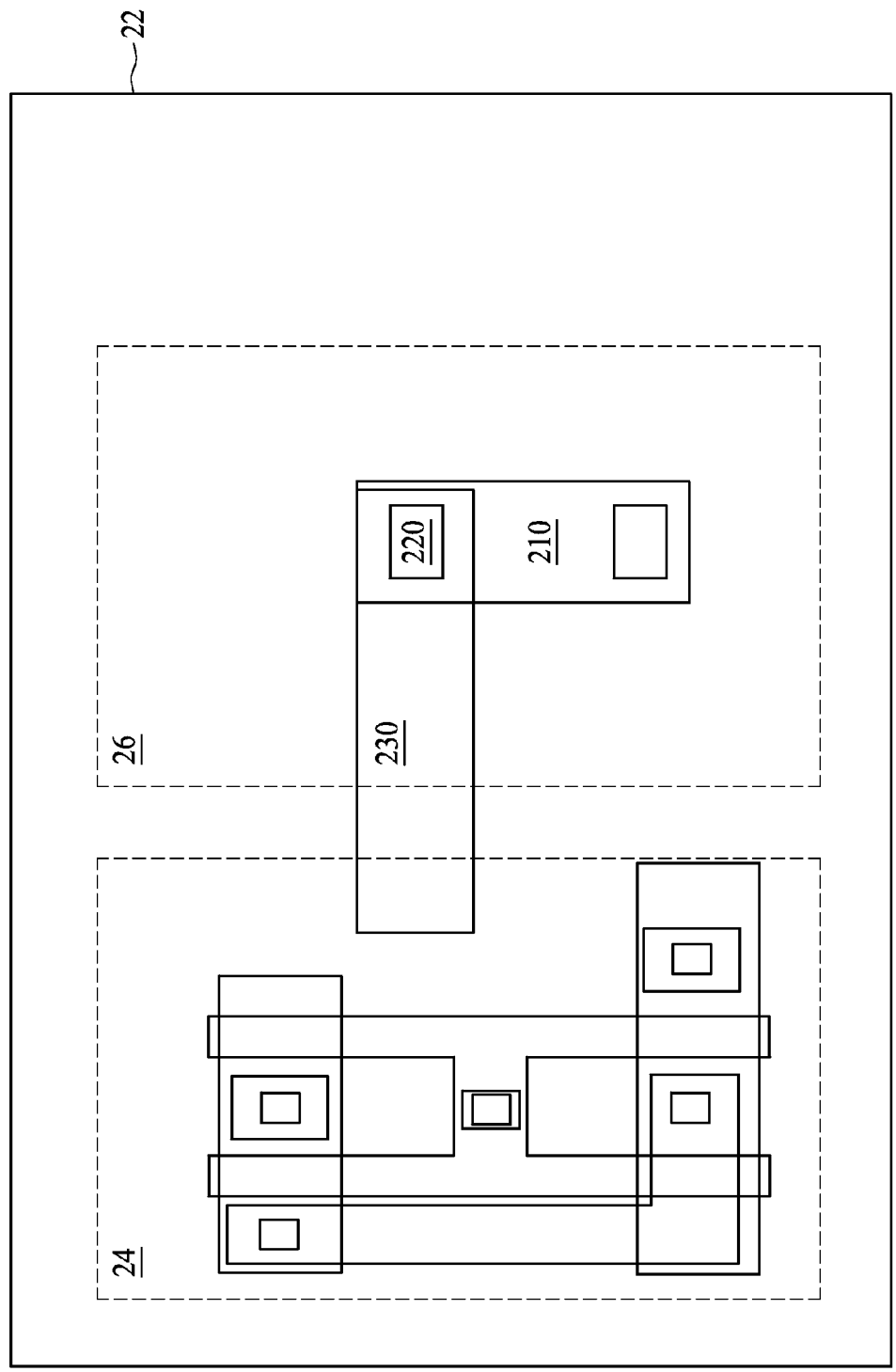
FIG. 2 is a schematic layout view of a semiconductor device, in accordance with some embodiments.

FIG. 2 is a schematic layout view of a semiconductor device 20, in accordance with some embodiments. The semiconductor device 20 includes a substrate 22 further including a first device region 24 and a second device region 26. Semiconductor components in the first device region 24 are similar to those in the substrate 12 described and illustrated with reference to FIG. 1A. Accordingly, no metal-2 layer is provided in the first device region 22.

The second device region 26 includes circuits that may serve other functions than an inverter. For convenience, in the second device region 26, only a metal-1 layer 210, a via 220 and a metal-2 layer 230 are shown in FIG. 2. The first metal-1 layer 210 is electrically connected to the metal-2 layer 230 via the via 220. Compared with the first device region 24, metal-2 layer is used in the second device region 26. Since no metal-2 layer is provided in the first device region 24, the metal-2 layer 230 can be extendable to the first device region 24, which facilitates the design flexibility. In that case, metal-2 process window in manufacturing the semiconductor device 20 can be accordingly enlarged. In contrast, if a metal-2 layer is used in the first device region 24, due to limitation of distances between the two metal-2 layers, the metal-2 layer 230 may not be extendable to the first device region 24, especially in view of the increasing demand for downsizing device features.

Figure 3:
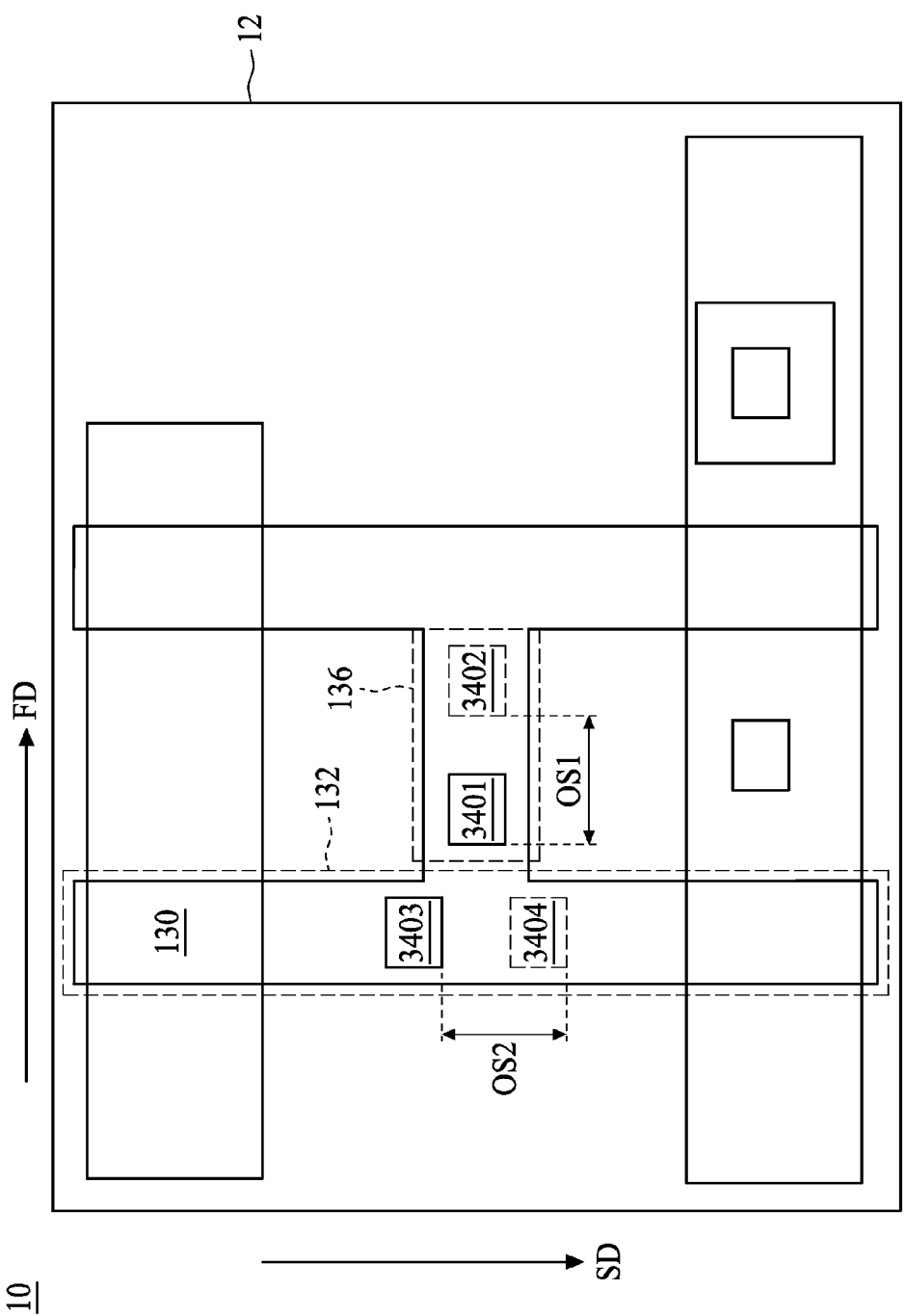
FIG. 3 is a schematic diagram illustrating a flexible position of a contact on a poly structure.

FIG. 3 is a schematic diagram illustrating a flexible position of a contact on the poly structure 130. For illustration, only active regions, poly structure and contacts are shown in FIG. 3. Furthermore, for convenience, a first target contact 3401, a first practical contact 3402, a second target contact 3403 and a second practical contact 3404 are shown in FIG. 3. A target contact refers to a position where a contact is planned to be formed, while a practical contact refers to a position where a contact is actually formed. Referring to FIG. 3, due to manufacturing deviation, offsets OS1 and OS2 may exist between the first target contact 3401 and the first practical contact 3402, and between the second target contact 3403 and the second practical contact 3404, respectively.

In the present embodiment, due to extension of the first leg 132 in the second direction SD, even though the second target contact 3403 is offset from the second practical contact 3404, the second practical contact 3404 is still in contact with the first leg 132 of the poly structure 130. As a result, electrical conduction between the poly structure 130 and the metal-1 layer is not affected, and the function of the inverter formed by the NMOS transistor 170 and the PMOS transistor 180 is not affected.

Similarly, due to extension of the body 136 in the first direction FD, even though the first target contact 3401 is offset from the first practical contact 3402, the first practical contact 3402 is still in contact with the body 136 of the poly structure 130. As a result, electrical conduction between the poly structure 130 and the metal-1 layer is not affected, and the function of the inverter formed by the NMOS transistor 170 and the PMOS transistor 180 is not affected.

In some existing approaches, a poly structure only includes a leg in the second direction SD like the leg 130. The single leg is used to electrically connect an NMOS transistor and a PMOS transistor, and serves as a common gate of the NMOS transistor and the PMOS transistor. If an offset occurs in the first direction FD during the manufacturing process, a contact may be partially located or completely not located at the poly structure. As a result, electrical conduction between the poly structure and the metal-1 layer is affected, and the function of the inverter is adversely affected. By comparison, the poly structure 130 according to the present disclosure allows a more flexible process window or overlay window for the contact position. For example, at the joints between the body 136 and the first leg 132 and second leg 134, an offset from the second target contact 3403 to the second practical contact 3402 is tolerable, which otherwise would not be allowed in the existing approaches.

Figure 4:
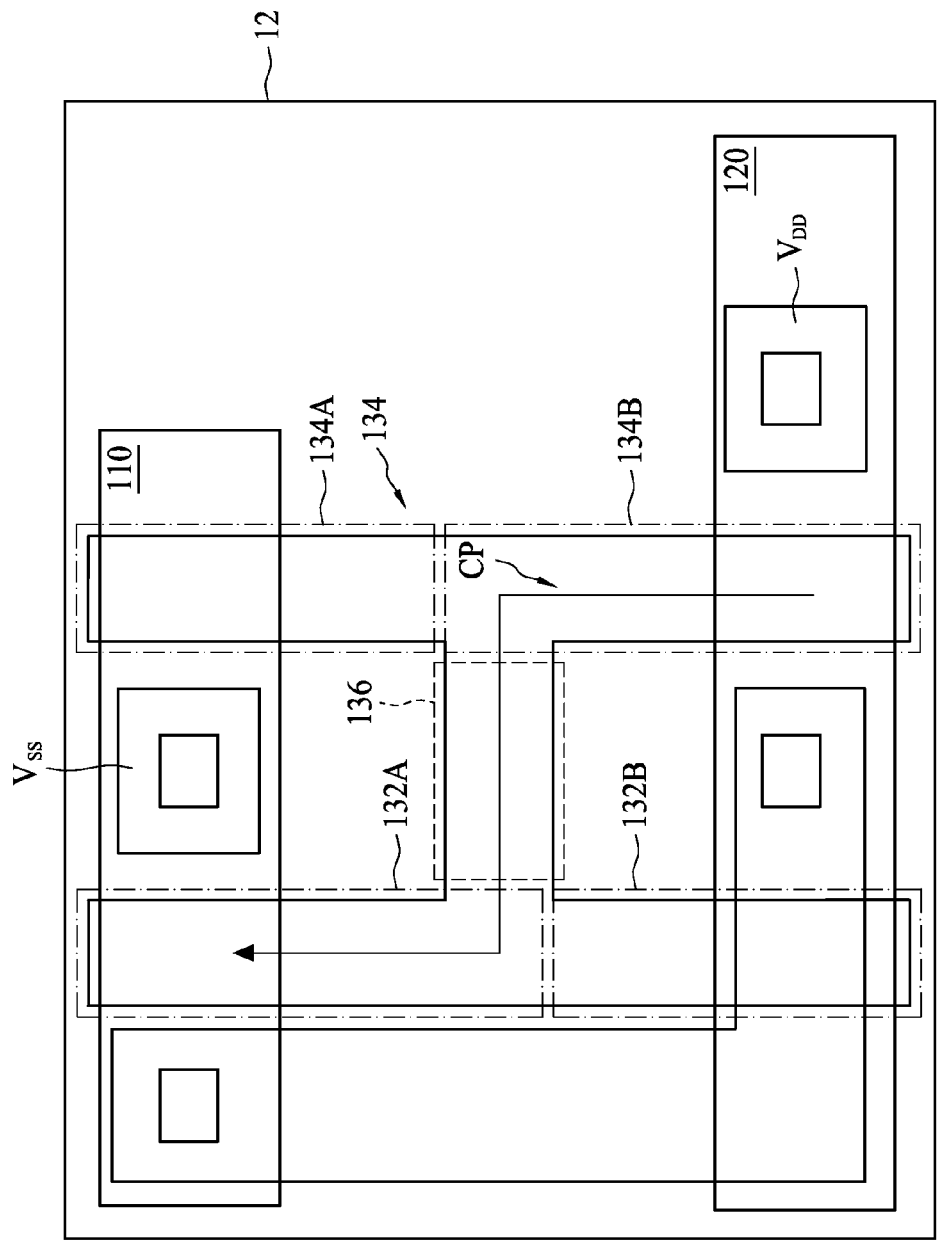
FIG. 4 is a schematic diagram illustrating a current path in a semiconductor device, in accordance with some embodiments.

FIG. 4 is a schematic diagram showing a current path CP in the semiconductor device 10 illustrated in FIG. 1A. Referring to FIG. 4, the first leg 132 can be partitioned into a first branch 132A and a second branch 132B. The second leg 134 can be partitioned into a first branch 134A and a second branch 134B. When the semiconductor device 10 receives electric power, current mainly flows from the first branch 132A through the body 136 to the second branch 134B as indicated by the current path CP, and less flows into the second branch 132B or the first branch 134A. Therefore, the second branch 132B and the first branch 134A are relatively insignificant and may be separated from the first leg 132 and the second leg 134, respectively. Such layout method and manufacturing method will be described in detail with reference to FIGS. 5A-5B, 6 and 7.

Figure 5A:
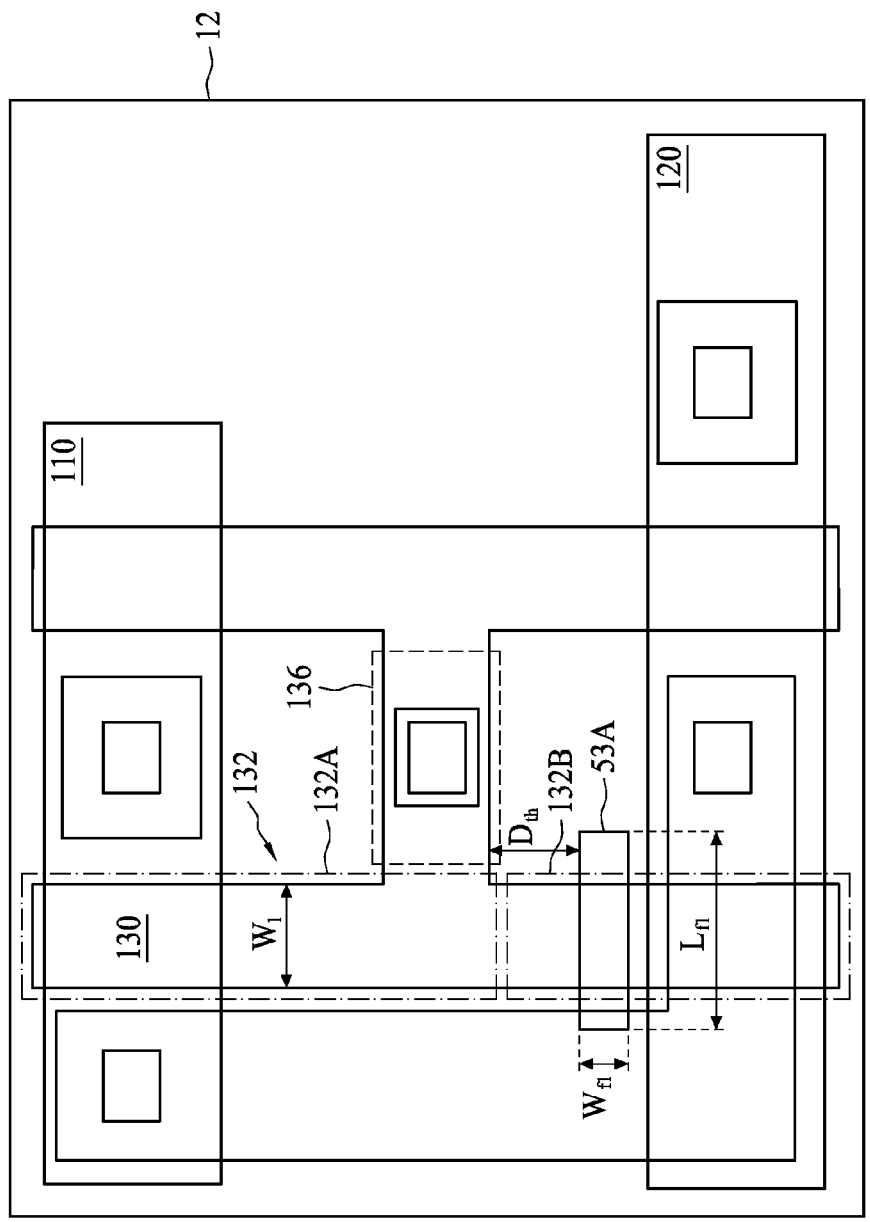
FIG. 5A is a schematic diagram of a semiconductor device, in accordance with some embodiments.

FIG. 5A is a schematic diagram of a semiconductor device 50A, in accordance with some embodiments. The semiconductor device 50A is similar to the semiconductor device 10 described and illustrated with to FIG. 1A except that, for example, a first device 53A is applied to the semiconductor device 50A during manufacturing process. Function of the first device 53A is similar to that of a photoresist, which is used to remove a part of the poly structure 130 covered by the first device 53A in an etching process. The first device 53A is formed at the first leg 132 between the body 136 and the second active region 120. The first device 53A has a width $W_{f1}$ in the second direction SD and a length $L_{f1}$ in the first direction FD. In some embodiments, the width $W_{f1}$ has a range of 2 to 2.6 times of the width $W_1$ of the first leg 132 in the first direction FD. In some embodiments, the length $L_{f1}$ has a range of approximately 120 nanometers (nm) to 170 nm.

To prevent the first device 53A from overlapping the second active region 120 such that the second active region 120 covered by the first device 43A might be inadvertently removed, distance between the body 136 and the first device 53A is kept smaller than a threshold distance $D_{th}$. In some embodiments, the threshold distance $D_{th}$ has a range of 0 nm to 100 nm. In the case that the threshold distance $D_{th}$ is approximately zero, the second branch 132B can be entirely removed. In another embodiment, the threshold distance $D_{th}$ has a range of 15 nm to 30 nm. In still another embodiment, the threshold distance $D_{th}$ has a range of 25 nm to 40 nm. In yet another embodiment, the threshold distance $D_{th}$ has a range of 30 nm to 60 nm.

Figure 5B:
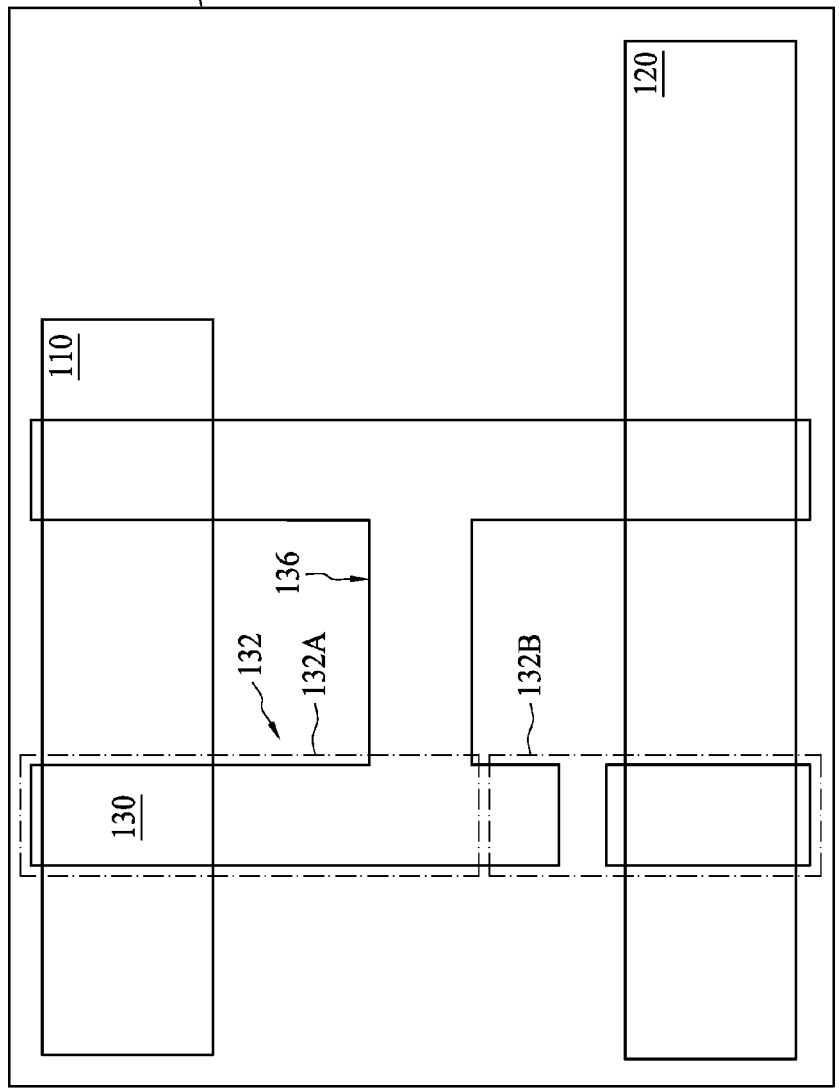
FIG. 5B is a schematic layout view of the semiconductor device shown in FIG. 5A, in accordance with some embodiments.

FIG. 5B is a schematic layout view of the semiconductor device 50A, in accordance with some embodiments. Referring to FIG. 5B, for convenience, only active regions and poly structure are shown. After an etching process, a part of the first leg 132 covered by the first device 53A is removed. By shortening the length of the first leg 132, a poly resistance of the poly structure 130 is reduced, such that operation speed of circuits including inverters formed by the PMOS transistor 180 and the NMOS transistor 170 is enhanced.

Figure 6:
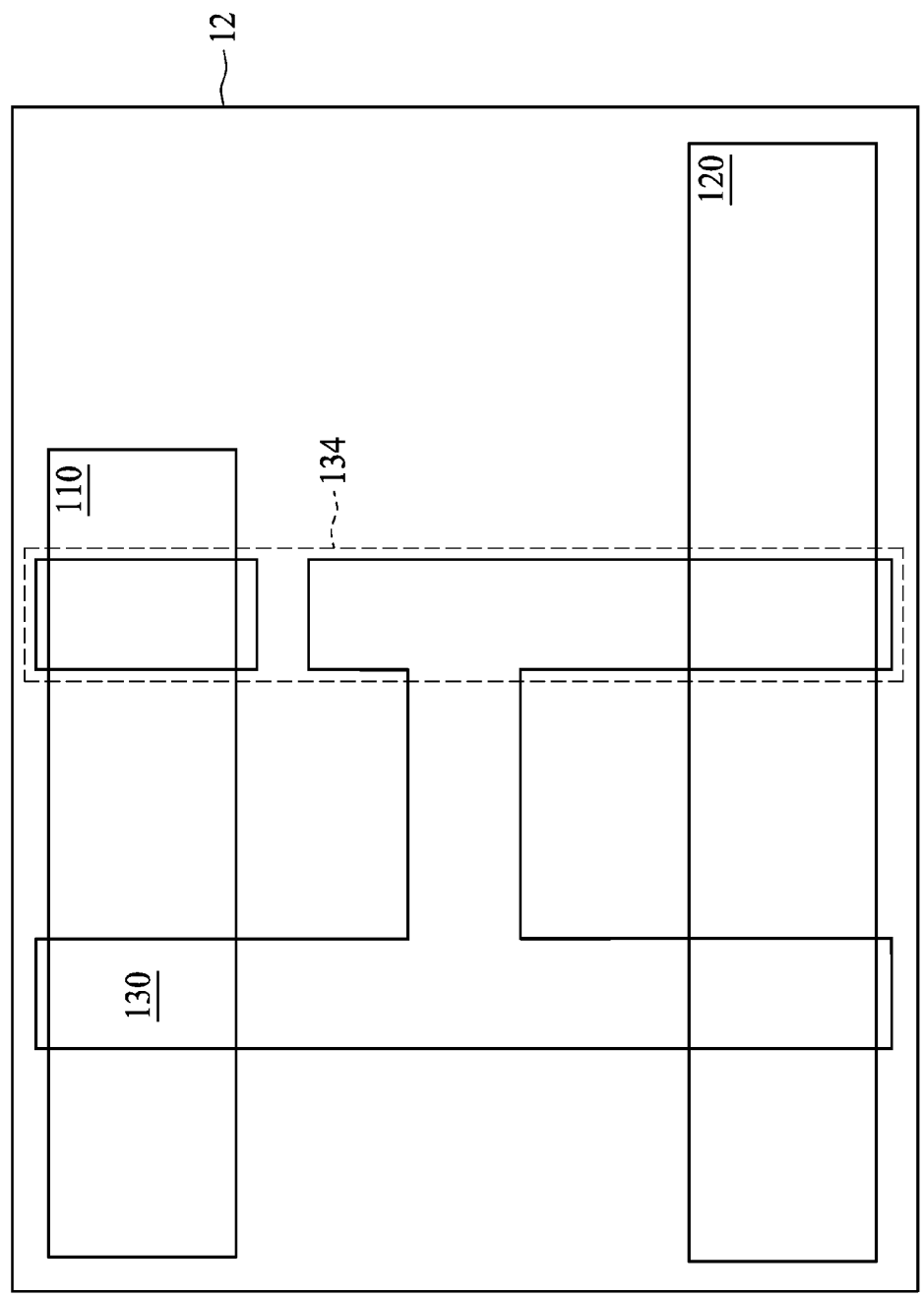
FIG. 6 is a schematic layout view of a semiconductor device, in accordance with some embodiments.

FIG. 6 is a schematic layout view of a semiconductor device 60, in accordance with some embodiments. Referring to FIG. 6 and also to FIG. 5A, the first device 53A in an embodiment is formed at the second leg 132 between the body 136 and the first active region 110. The first device 53A is used to remove a part of the second leg 134 covered thereby. In some embodiments, distance between the body 136 and the first device 53A is kept smaller than the threshold distance $D_{th}$. In some embodiments, the threshold distance $D_{th}$ has a range of 0 nm to 100 nm. In another embodiment, the threshold distance $D_{th}$ has a range of 15 nm to 30 nm. In still another embodiment, the threshold distance $D_{th}$ has a range of 25 nm to 40 nm. In yet another embodiment, the threshold distance $D_{th}$ has a range of 30 nm to 60 nm.

Figure 7:
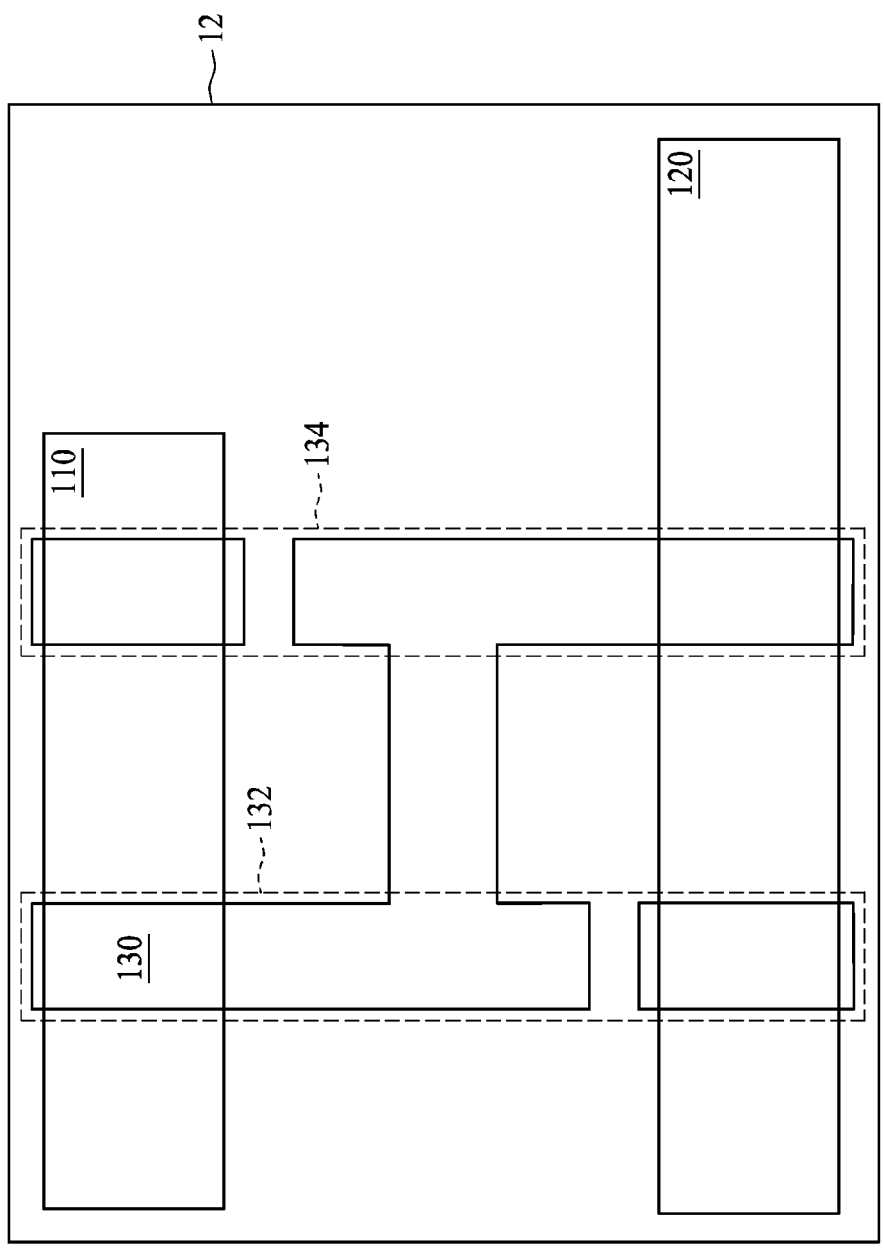
FIG. 7 is a schematic layout view of a semiconductor device, in accordance with some embodiments.

FIG. 7 is a schematic layout view of a semiconductor device 70, in accordance with some embodiments. In layout design, two first devices 53A are arranged at the first leg 132 between the body 136 and the second active region 120, and at the second leg 132 between the body 136 and the first active region 110, respectively. Each first device 53A is spaced apart from the body 136 by a distance smaller than the threshold distance $D_{th}$. Referring to FIG. 7, in the resultant poly structure 130, a part of the second leg 134 and a part of the first leg 132 have been removed.

Figure 8:
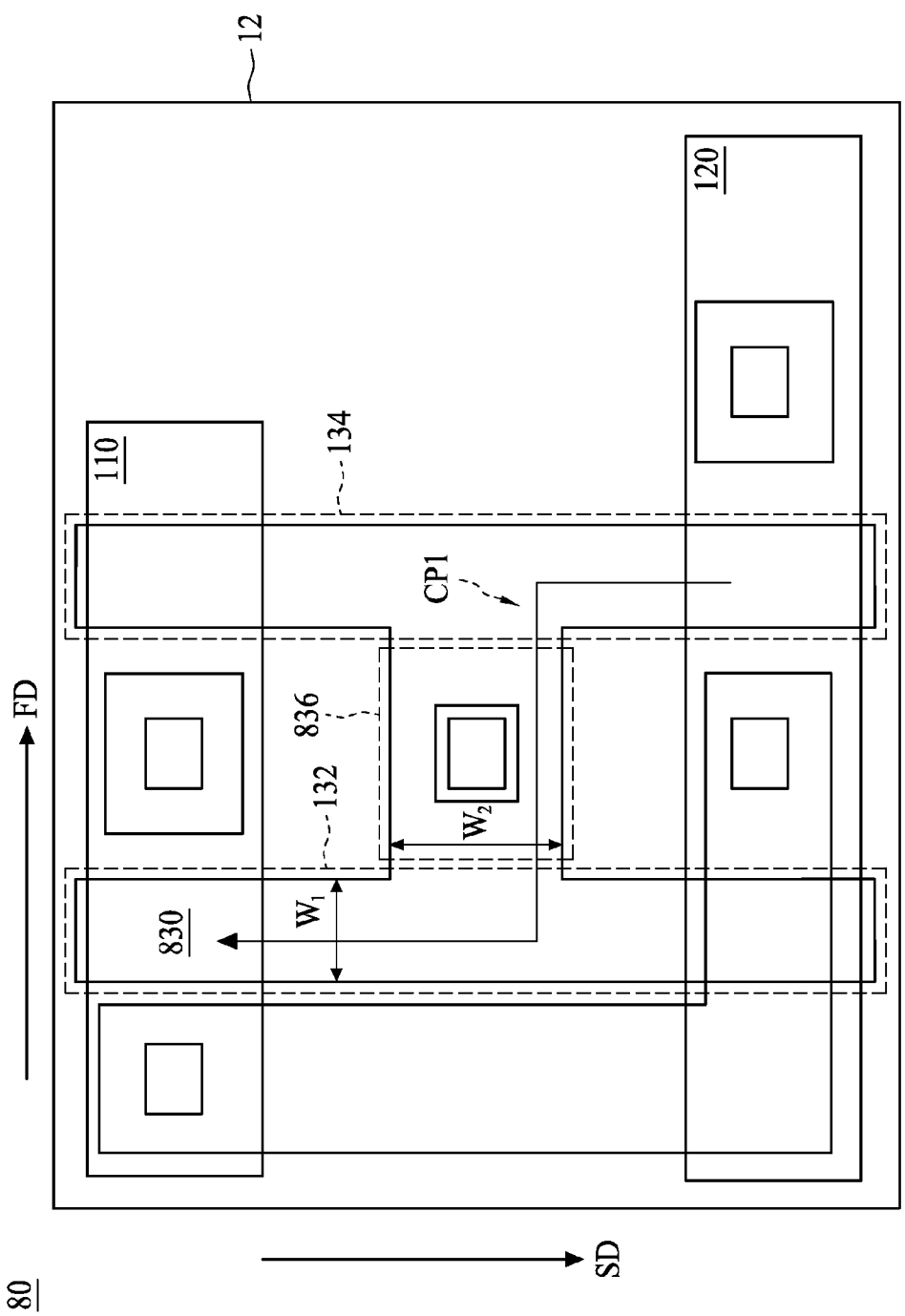
FIG. 8 is a schematic layout view of a semiconductor device, in accordance with some embodiments.

FIG. 8 is a schematic layout view of a semiconductor device 80, in accordance with some embodiments. Referring to FIG. 8, the semiconductor device 80 is similar to the semiconductor device 10 described and illustrated with reference to FIG. 1A except a poly structure 830. Moreover, the poly structure 830 is similar to the poly structure 130 described and illustrated with reference to FIG. 1A except that a body 836 has a width $W_2$ in the second direction SD than the width $W_1$ of the first leg 132 in the first direction FD.

By such design, poly resistance can be reduced. For similar reasons as described in the embodiment illustrated in FIG. 4, current mainly flows into a part of the poly structure 830 as indicated by a current path CP1. Since resistance is inversely proportional to the average width of a path, the poly resistance decreases as the width $W_2$ of the poly structure 830 increases.

Since the second branch 132 B of the first leg 132 and the first branch 134 A of the second leg 134 are insignificant in current conducting, in some embodiments, a part or the whole of the second branch 132B of the first leg 132 can be removed from the poly structure 830. As a result, the first leg 132 of the poly structure 830 is similar to that described and illustrated with reference to FIG. 5B. Likewise, a part or the whole of the first branch 134A of the second leg 134 can be removed from the poly structure 830. As a result, the second leg 134 of the poly structure 830 is similar to that described and illustrated with reference to FIG. 6. Similarly, a part or the whole of each of the second branch 132B of the first leg 132 and the first branch 134 A of the second leg 134 can be removed from the poly structure 830. As a result, the first leg 132 and the second leg 134 of the poly structure 830 are similar to those described and illustrated with reference to FIG. 7.

Figure 9A:
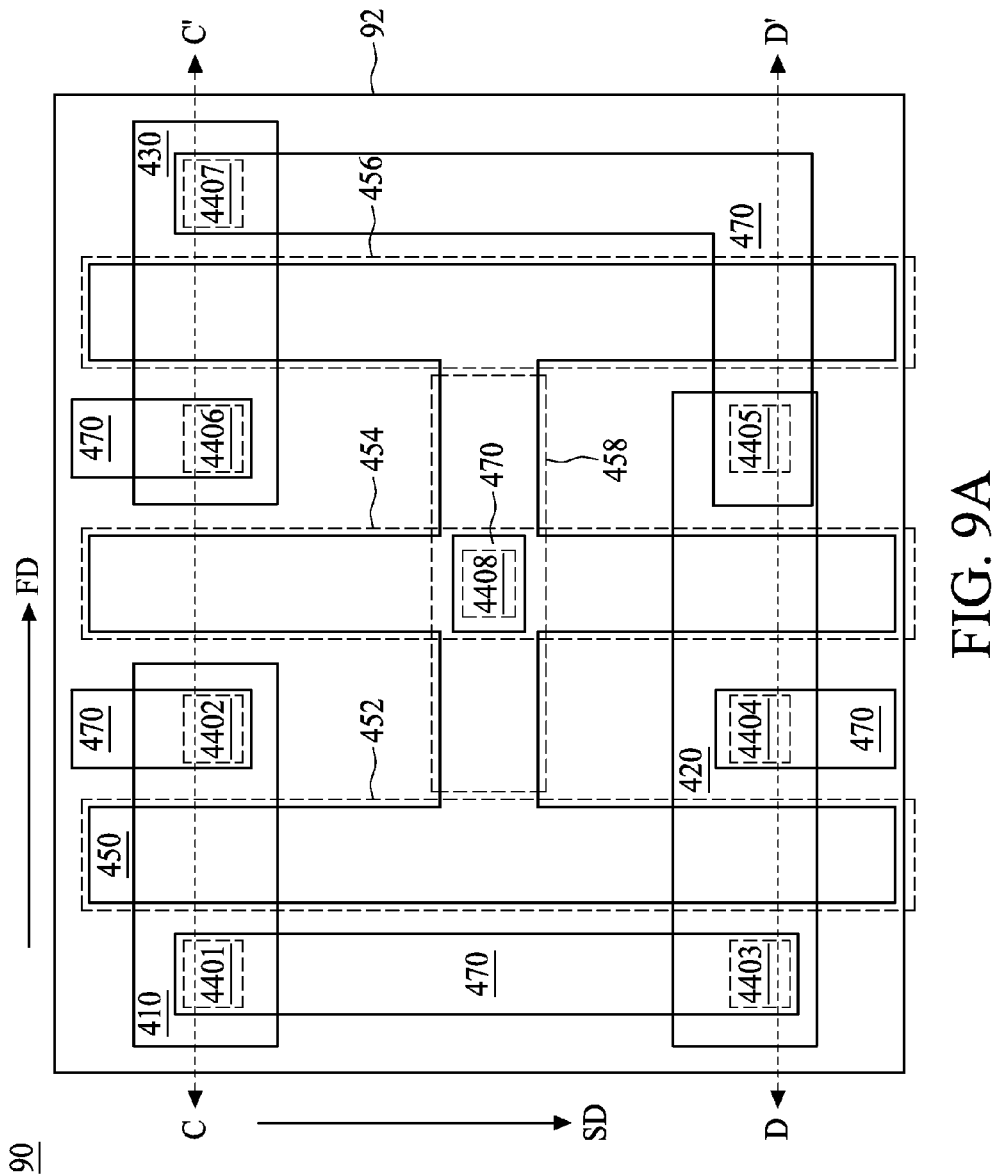
FIG. 9A is a schematic layout view of a semiconductor device, in accordance with some embodiments.

FIG. 9A is a schematic layout view of a semiconductor device 90, in accordance with some embodiments. Referring to FIG. 9A, the semiconductor device 90 includes a substrate 92 and a poly structure 450 on the substrate 92. The substrate 92A includes a first active region 410, a second active region 420, and a third active region 430. The first active region 410, the second active region 420 and the third active region 430 substantially extend in the first direction FD.

The poly structure 450 includes a first leg 452, a second leg 454, a third leg 456 and a body 458. The first leg 452 connects the first active region 410 and the second active region 420, and extends substantially in the second direction SD. The second leg 454 is connected to the second active region 420 and extends substantially in the second direction SD through the body 458. The third leg 456 is connected to the third active region 430 and extends in substantially the second direction SD. The body 458 extends substantially in the first direction FD, and is arranged to connect the first leg 452, the second leg 454 and the third leg 456.

The semiconductor device 90 further includes contacts for interconnection. In the present embodiment, a first contact 4401 and a second contact 4402 are used to electrically connect the first active region 410 and a patterned conductive layer 470, for example, a metal-1 layer. Moreover, a third contact 4403, a fourth contact 4404 and a fifth contact 4405 are used to electrically connect the second active region 420 and the metal-1 layer 470. Furthermore, a sixth contact 4406 and a seventh contact 4407 are used to electrically connect the third active region 430 and the metal-1 layer 470. Additionally, an eighth contact 4408 is used to electrically connect the poly structure 450 and the metal-1 layer 470.

Figure 9B:
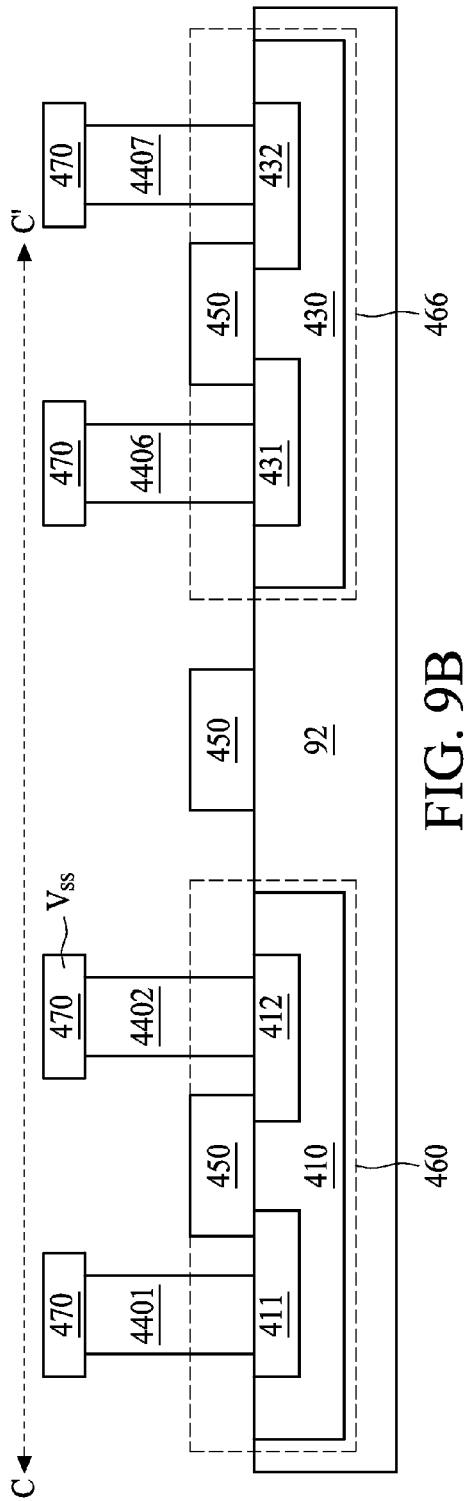
FIG. 9B is a cross-section diagram of the substrate of the semiconductor device shown in FIG. 9A taken along a line C-C', in accordance with some embodiments.

FIG. 9B is a cross-sectional diagram of the semiconductor device 90 shown in FIG. 9 taken along a line C-C', in accordance with some embodiments. Referring to FIG. 9B, the first active region 410 includes a first n-type region 411 and a second n-type region 412. The first n-type region 411, the second n-type region 412 and the poly structure 450 serve as a first NMOS transistor 460. The first n-type region 411 serves as a drain terminal of the first NMOS transistor 460, and is coupled to the metal-1 layer 470 via the first contact 4401. The second n-type region 412 serves as a source terminal of the first NMOS transistor 460, and is coupled to the metal-1 layer 470 via the second contact 4402 to receive a reference voltage $V_{SS}$. The poly structure 450 serves as a gate terminal of the first NMOS transistor 460.

The third active region 430 includes a first n-type region 431 and a second n-type region 432. The first n-type region 431, the second n-type region 432 and the poly structure 450 serve as a second NMOS transistor 466. The first n-type region 431 serves as a source terminal of the second NMOS transistor 466, and is coupled to the metal-1 layer 470 via the sixth contact 4406 to receive the reference voltage $V_{SS}$. The second n-type region 432 serves as a drain terminal of the second NMOS transistor 466, and is coupled to the metal-1 layer 470 via the seventh contact 4407. The poly structure 450 serves as a gate terminal of the second NMOS transistor 466. Accordingly, the poly structure 450 serves as a common gate of the first NMOS transistor 460 and the second NMOS transistor 466.

Figure 9C:
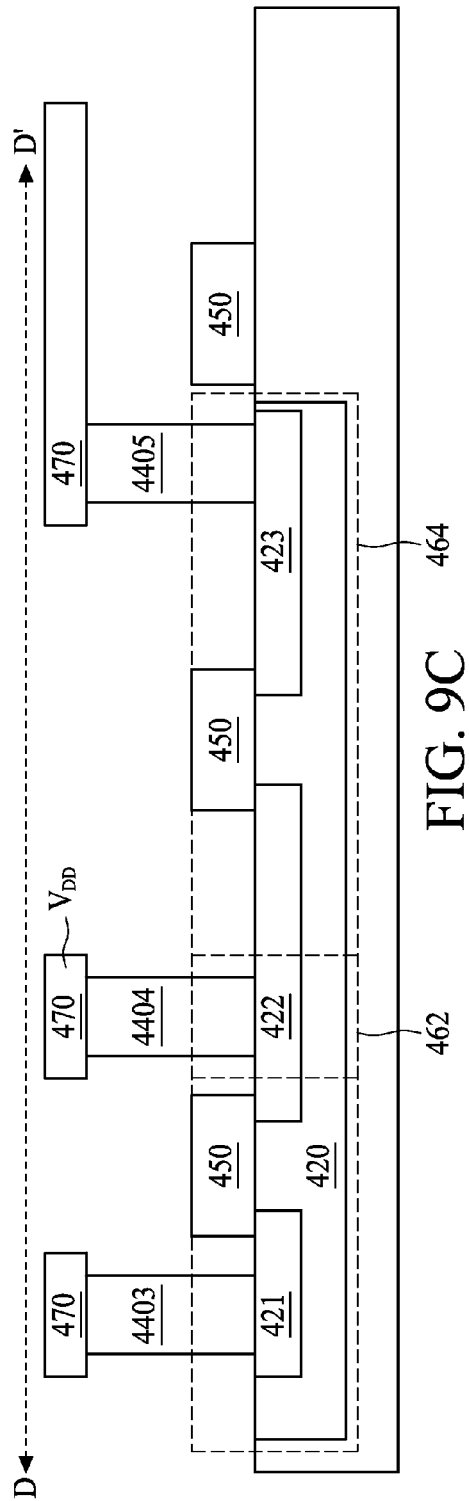
FIG. 9C is a cross-section diagram of the substrate of the semiconductor device shown in FIG. 9A taken along a line D-D', in accordance with some embodiments.

FIG. 9C is a cross-sectional diagram of the semiconductor device 90 shown in FIG. 9A taken along a line D-D', in accordance with some embodiments. Referring to FIG. 9C, the second active region 420 includes a first p-type region 421, a second p-type region 422 and a third p-type region 423. The first p-type region 421, the second p-type region 422 and the poly structure 450 serve as a first PMOS transistor 462. The first p-type region 421 serves as a drain terminal of the first PMOS transistor 462, and is coupled to the metal-1 layer 470 via the third contact 4403. Referring back to FIG. 9A, the third contact 4403, the metal-1 layer 470 and the first contact 4401 are used to couple the first NMOS transistor 460 and the first PMOS transistor 462, such that, referring to FIG. 9C, the drain terminals of the first NMOS transistor 460 and the first PMOS transistor 462 are coupled to each other. The second p-type region 422 serves as a source terminal of the first PMOS transistor 462, and is coupled to the metal-1 layer 470 via the fourth contact 4404 to receive the supply voltage $V_{DD}$. The poly structure 450 serves as a gate terminal of the first PMOS transistor 462.

Similarly, the second p-type region 422, the third p-type region 423 and the poly structure 450 serve a second PMOS transistor 450. The second p-type region 422 also serves as a source terminal of the second PMOS transistor 464, and is coupled to the metal-1 layer 470 via the fourth contact 4404 to receive the supply voltage $V_{DD}$. The second p-type region 422 is the common source of the first PMOS transistor 462 and the second PMOS transistor 464. The third p-type region 423 serves as a drain terminal of the second PMOS transistor 464, and is coupled to the metal-1 layer 470 via the fifth contact 4405. Referring back to FIG. 9A, the fifth contact 4405, the metal-1 layer 470 and the seventh contact 4407 are used to couple the second PMOS transistor 464 to the second NMOS transistor 466, such that, referring to FIG. 9A, the drain terminals of the second PMOS transistor 464 and the second NMOS transistor 466 are coupled to each other. The poly structure 450 serves as a gate terminal of the second PMOS transistor 464. Accordingly, the poly structure 450 serves as a common gate of the first NMOS transistor 460, the second NMOS transistor 466, the first PMOS transistor 462 and the second PMOS transistor 464.

The layout method as illustrated and described with reference to FIG. 9A can be widely applied to circuits using inverters, such as an analog-to-digital converter (ADC), a digital-to-analog converter (DAC) and a multiplexer.

As shown in FIGS. 9A, 9B and 9C, no metal-2 layer is used to connect the first NMOS transistor 460, the second NMOS transistor 466, the first PMOS transistor 462 and the second PMOS transistor 464. For similar reasons as described in the embodiment illustrated in FIGS. 1A, 1B and 1C, such layout method can eliminate the need for a metal mask in the inverter area. Moreover, for similar reasons as described in the embodiment illustrated in FIG. 2, the metal-2 layer process window can be enlarged.

Furthermore, for similar reasons as described in the embodiment illustrated in to FIG. 3, due to extension of the body 458 in the first direction FD, if an offset occurs in the first direction FD during the manufacturing process, contacts are still in contact with the body 458 of the poly structure 450. As a result, electrical conduction between the poly structure 450 and the metal-1 layer is not affected, and the function of two inverters formed by the first NMOS transistor 460, the second NMOS transistor 466, the first PMOS transistor 462 and the second PMOS transistor 464 is not affected.

Additionally, the poly structure 450 according to the present disclosure allows a more flexible process window or overlay window for the contact position. For example, at the joints between the body 458 and the first leg 452 and second leg 454, an offset for the contact position is tolerable, which otherwise would not be allowed in the existing approaches.

Figure 9D:
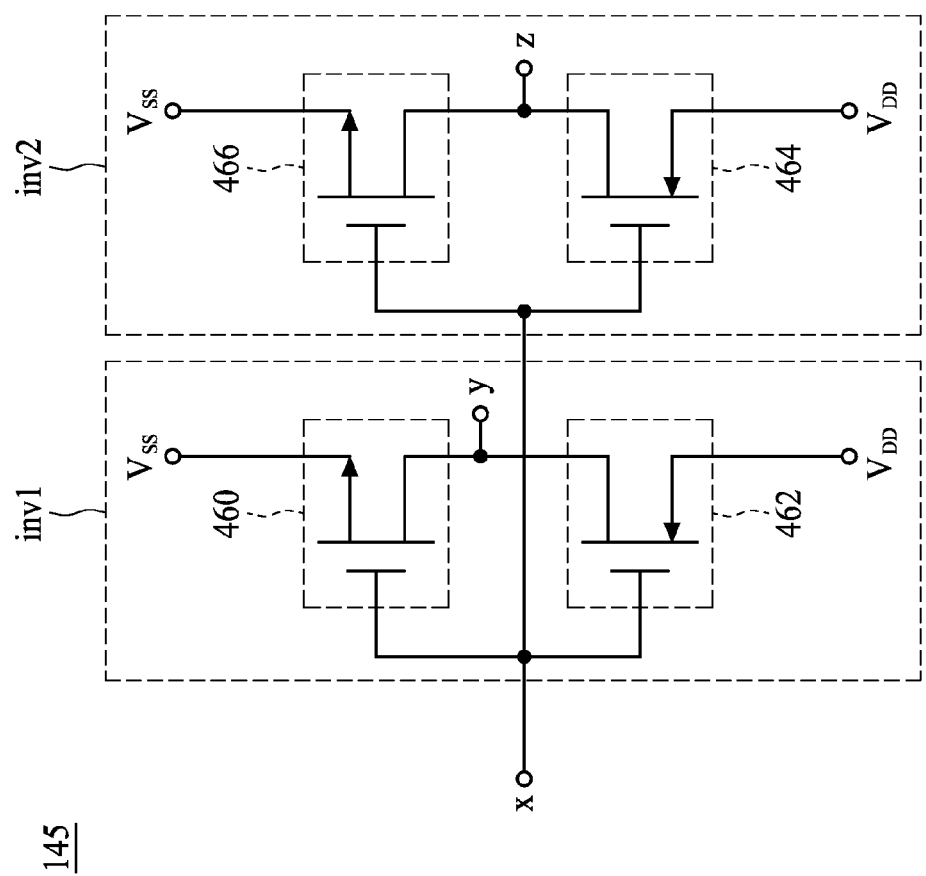
FIG. 9D is a circuit diagram of an equivalent circuit of the semiconductor device shown in FIG. 9A, in accordance with some embodiments.

FIG. 9D is a circuit diagram of an equivalent circuit 145 of the semiconductor device 90, in accordance with some embodiments. Referring to FIG. 9D, the equivalent circuit 145 includes the first NMOS transistor 460, the second NMOS transistor 466, the first PMOS transistor 462 and the second PMOS transistor 464.

The source terminal of the first NMOS transistor 460 is coupled to the node $V_{SS}$. The gate terminals of the first NMOS transistor 460 and the first PMOS transistor 462 are coupled together at a node x. The drain terminals of the first NMOS transistor 460 and the first PMOS transistor 462 are coupled together at a node y. The source terminal of the first PMOS transistor 462 is coupled to the supply voltage $V_{DD}$. In this embodiment, the first NMOS transistor 460 and the first PMOS transistor 462 serve as a first inverter inv1.

Likewise, the source terminal of the second NMOS transistor 466 is coupled to the node $V_{SS}$. The gate terminals of the second NMOS transistor 466 and the second PMOS transistor 464 are coupled together at the node x. The drain terminals of the second NMOS transistor 466 and the second PMOS transistor 464 are coupled together at a node z. The source terminal of the second PMOS transistor 464 is coupled to the node $V_{DD}$. The second NMOS transistor 466 and the second PMOS transistor 462 serve as a second inverter inv2.

Figure 9E:
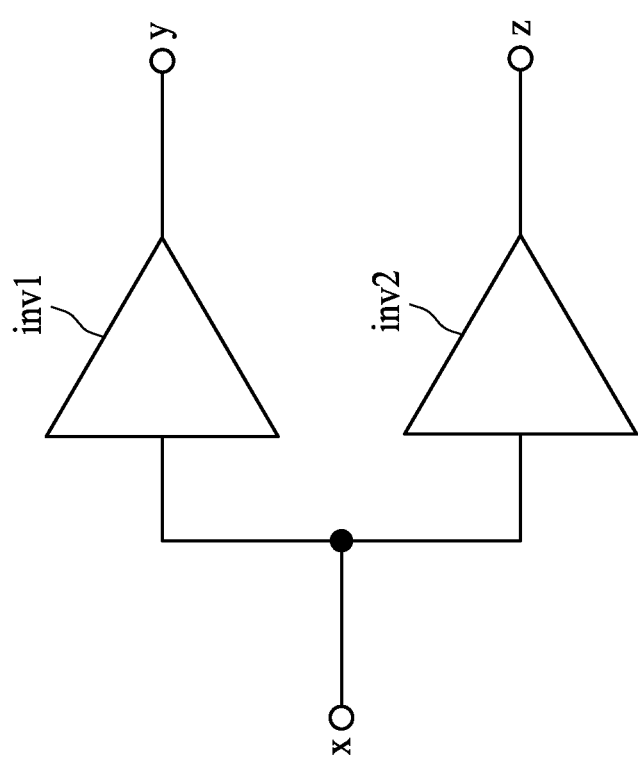
FIG. 9E is a circuit symbol of the equivalent circuit illustrated in FIG. 9D.

FIG. 9E is a circuit symbol of the equivalent circuit 145, in accordance with some embodiments. Referring to FIG. 9E, inputs of the first inverter inv1 and the second inverter inv2 are coupled together at the node x. An output of the inverter inv1 is coupled to the node y. An output of the inverter inv2 is coupled to the node z.

Figure 10A:
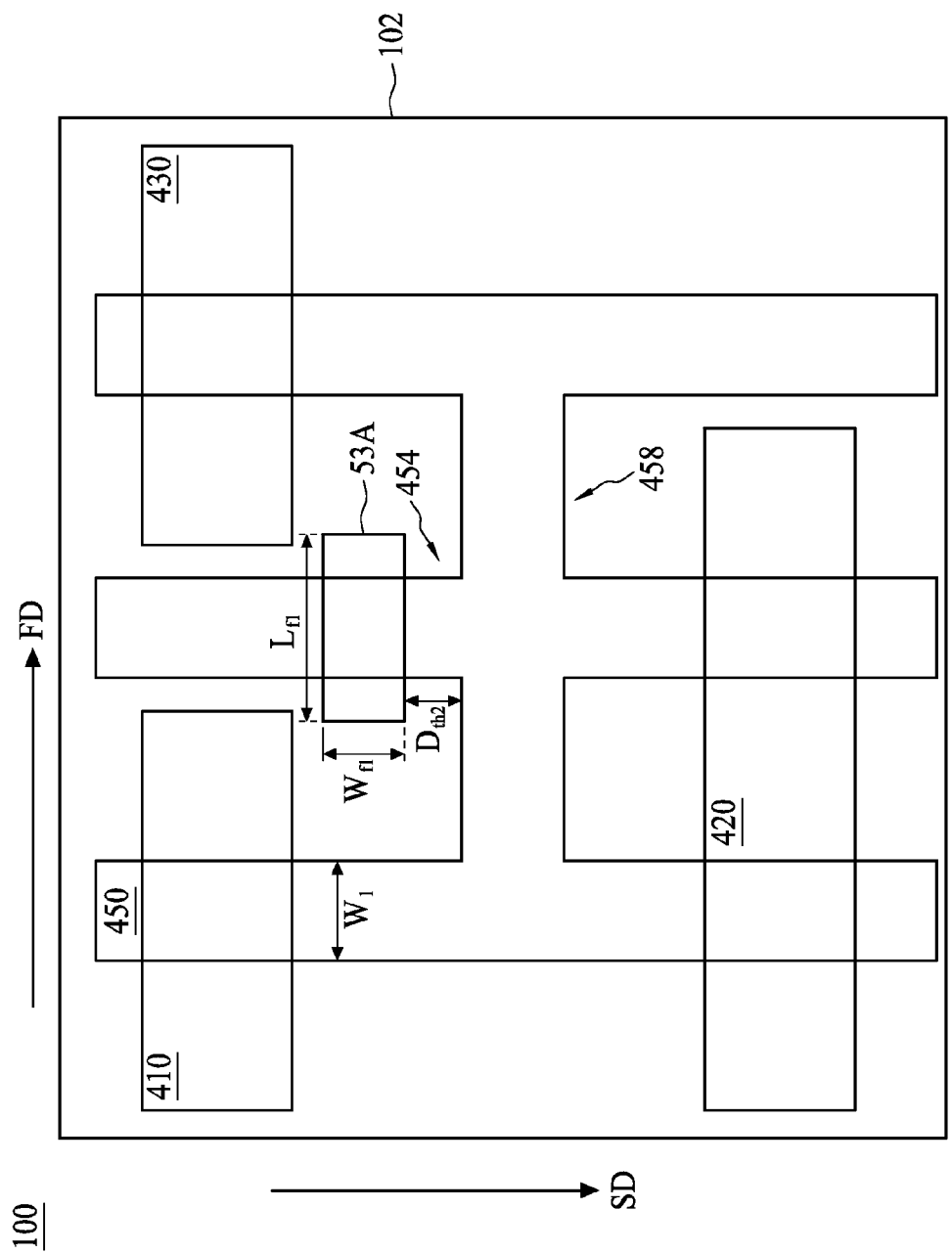
FIG. 10A is a schematic diagram of a semiconductor device, in accordance with some embodiments.

FIG. 10A is a schematic diagram of a semiconductor device 100, in accordance with some embodiments. For illustration, only active regions and poly structure are shown. Referring to FIG. 10A, the semiconductor device 100 is similar to the semiconductor device 90 described and illustrated with reference to FIG. 9 except that, for example, a first device 53A is applied to the semiconductor device 100. The first device 53A in the present embodiment is formed at the second leg 454 between the body 458 and the first active region 410 (or the third active region 430). The first device 53A has a width $W_{f1}$ in the second direction SD and a length $L_{f1}$ in the first direction FD. In some embodiments, the width $W_n$ of the first device 53A has a range of 2 to 2.6 times of the width $W_1$ of the first leg 452. Moreover, the length $L_{f1}$ of the first device 53A has a range of approximately 120 nm to 170 nm.

To prevent the first device 53A from overlapping the first active region 410 or the third active region 430 such that the first active region 410 or the third active region 430 covered by the first device 53A might be inadvertently removed, distance between the body 458 and the first device 53A is kept smaller than a threshold distance $D_{th2}$. In some embodiments, the threshold distance $D_{th2}$ has a range of 0 nm to 100 nm. In another embodiment, the threshold distance $D_{th2}$ has a range of 15 nm to 30 nm. In still another embodiment, the threshold distance $D_{th2}$ has a range of 25 nm to 40 nm. In yet another embodiment, the threshold distance $D_{th2}$ has a range of 30 nm to 60 nm.

Figure 10B:
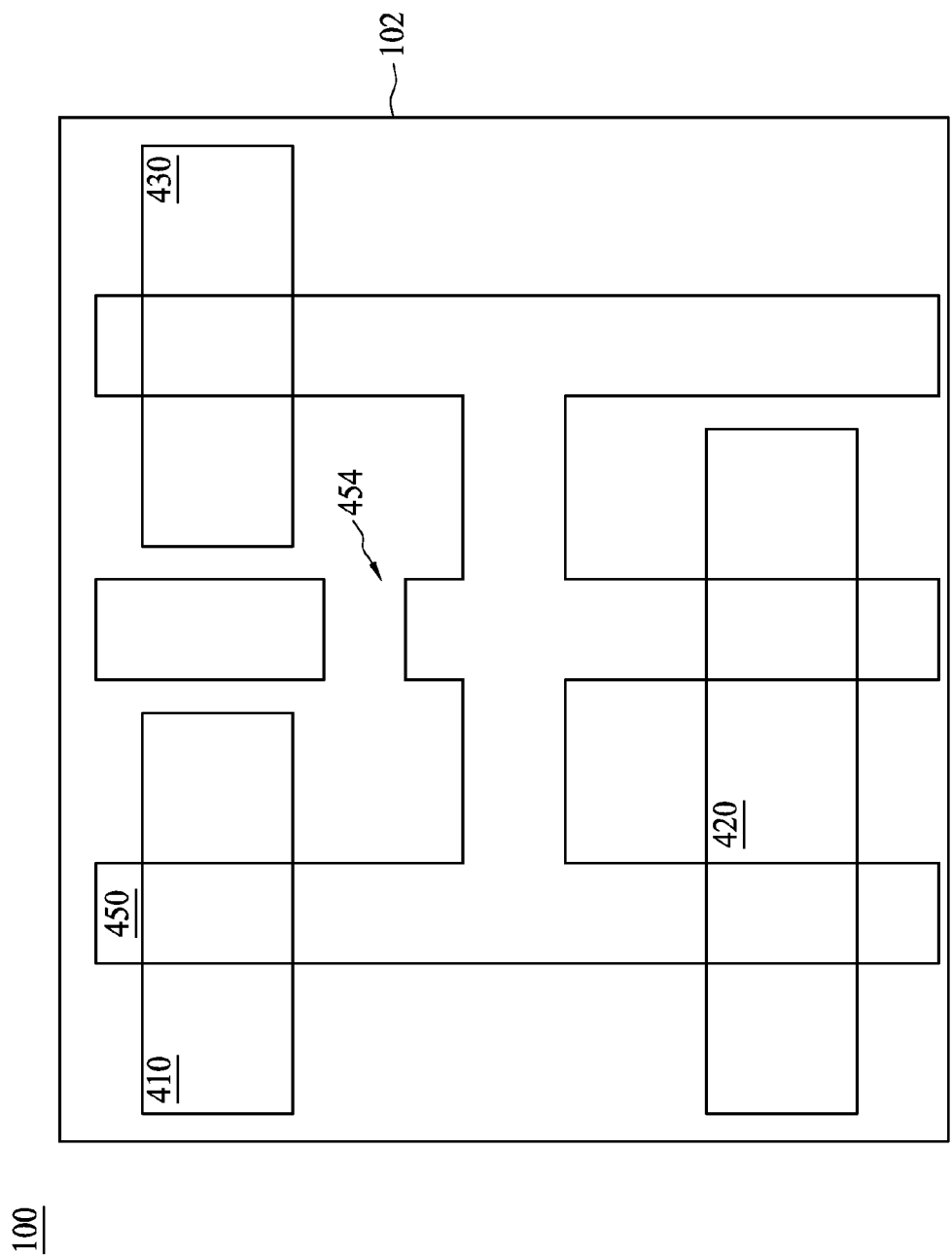
FIG. 10B is a schematic layout view of a semiconductor device, in accordance with some embodiments.

FIG. 10B is a schematic layout view of the semiconductor device 100, in accordance with some embodiments. Referring to FIG. 10B, for convenience, only active regions and poly structure are shown. After an etching process, a part of the second leg 454 covered by the first device 53A is removed. By shortening the length of the second leg 454, a poly resistance of the poly structure 450 is reduced, such that operation speed of circuits including the two inverters formed by the first NMOS transistor 460, the second NMOS transistor 466, the first PMOS transistor 462 and the second PMOS transistor 464 is enhanced.

Figure 11:
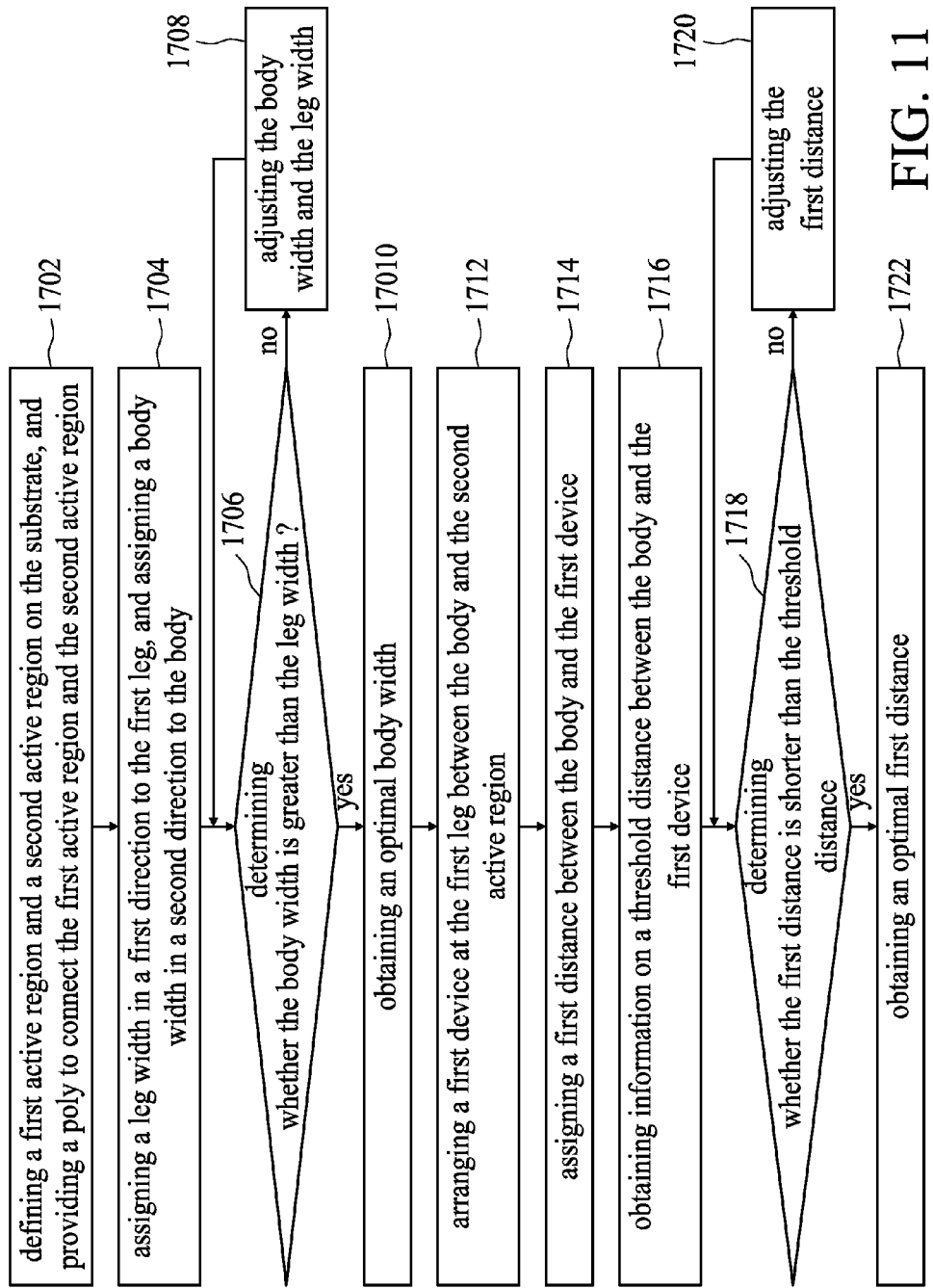
FIG. 11 is a flow diagram illustrating a method of designing a layout of a semiconductor device, in accordance with some embodiments.

FIG. 11 is a flow diagram illustrating a method of designing a layout of a semiconductor device, in accordance with some embodiments. Referring to FIG. 11, in operation 1702, a first active region and a second active region are defined on the substrate, and a poly structure is provided to connect the first active region and the second active region. The poly structure includes a first leg, a second leg and a body. The body is arranged to connect the first leg and the second leg.

In operation 1704, initially a leg width in a first direction is assigned to the first leg, and a body width in a second direction different from the first direction is assigned to the body. In an embodiment, the body width has a range of 40 nm-90 nm.

In operation 1706, it is determined whether the body width is greater than the leg width. If not, in operation 1708, the body width and the leg width are adjusted and operation 1706 is repeated. If affirmative, in operation 1710, an optimal body width for the body is determined.

Subsequent to operation 1710, in operation 1712, a first device is disposed at the first leg between the body and the second active region.

In operation 1714, a first distance between the body and the first device is assigned.

In operation 1716, information on a threshold distance between the body and the first device is obtained.

In operation 1718, it is determined whether the first distance is shorter than the threshold distance. If not, in operation 1720, the first distance is adjusted and operation 1718 is repeated. If affirmative, in operation 1722, an optimal first distance is obtained.

It should be noted that operations 1702-1710 and operations 1712-1722 can be independent of each other. Operations 1702-1710 can be operated alone without operations 1712-1722. Likewise, operations 1712-1722 can be operated alone without operations 1702-1710. Alternatively, operations 1702-1710 and operations 1712-1722 can be interchangeable in order.

Some embodiments have one or a combination of the following features and/or advantages. In some embodiments, a semiconductor device comprises a first active region, a second active region and a conductive metal structure. The second active region is separate from the first active region. The conductive metal structure is arranged to connect the first active region and the second active region. The conductive metal structure includes a first leg, a second leg and a body. The second leg is separate from the first leg. The body extends between and connects the first leg and the second leg.

In some embodiments, in a method of designing a layout of a semiconductor device, a first active region and the second active region are defined on a substrate, and a conductive metal structure is provided. The conductive metal structure is arranged to connect the first active region and the second active region. The conductive metal structure includes a first leg, a second leg and a body. The body is arranged to connect the first leg and the second leg. The first active region, the second active region and the conductive metal structure are composed of a part of patterns for inverters. A leg width at a first direction is assigned to the first leg. A body width at a second direction perpendicular to the first direction is assigned to the body. The leg width and the body width are adjusted until the body width is greater than the leg width.

In some embodiments, in a method of manufacturing a semiconductor device, a substrate is provided. A first active region and a second active region are formed in the substrate. A conductive metal structure is disposed on the substrate to connect the first active region and the second active region. The conductive metal structure includes a first leg, a second leg and a body. The body is arranged to connect the first leg and the second leg. The first active region, the second active region and the conductive metal structure are composed of a part of patterns for inverters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first active region of a substrate;
a second active region of the substrate, wherein the second active region is separate from the first active region; and
a conductive metal structure arranged to connect the first active region and the second active region, the conductive metal structure including a first leg of the conductive metal structure, a second leg of the conductive metal structure, and a body of the conductive metal structure extending between and connecting the first leg and the second leg, wherein the second leg is separate from the first leg, and the first leg, the second leg and the body are in the same semiconductor layer.

2. The semiconductor device as claimed in claim 1, wherein each of the first leg and the second leg connects the first active region and the second active region.

3. The semiconductor device as claimed in claim 1, wherein one of the first leg and the second leg connects the first active region and the second active region.

4. The semiconductor device as claimed in claim 1, wherein the first leg is connected to one of the first action region and the second active region, and the second leg is connected to the other one of the first active region and the second active region.

5. The semiconductor device as claimed in claim 1, wherein a width of the first leg in a first direction is greater than a width of the body in a second direction different from the first direction.

6. The semiconductor device as claimed in claim 5, wherein each of the first leg and the second leg connects the first active region and the second active region.

7. The semiconductor device as claimed in claim 5, wherein one of the first leg and the second leg connects the first active region and the second active region.

8. The semiconductor device as claimed in claim 5, wherein the first leg is connected to one of the first action region and the second active region, and the second leg is connected to the other one of the first active region and the second active region.

9. The semiconductor device as claimed in claim 1, wherein the first active region and the conductive metal structure define a first transistor, and the second active region and the conductive metal structure define a second transistor, the first transistor and the second transistor serving as an inverter.

10. A semiconductor device, comprising:
a first active region of a substrate;
a second active region of the substrate, wherein the second active region is separate from the first active region;
a third active region of the substrate, wherein the third active region is separate from the second active region and the first active region; and
a conductive metal structure arranged to connect the first active region and the second active region, the conductive metal structure including a first leg of the conductive metal structure, a second leg of the conductive metal structure, a third leg of the conductive metal structure separate from the first leg and the second leg, and a body of the conductive metal structure extending between and connecting the first leg, the second leg and the third leg, wherein the second leg is separate from the first leg, and the first leg, the second leg, the third leg and the body are in the same semiconductor layer.

11. The semiconductor device as claimed in claim 10, wherein the first leg connects the first active region and the third active region, the second leg is connected to the second active region through the body, and the third leg is connected to the third active region.

12. The semiconductor device as claimed in claim 11, wherein a length of the first leg in a second direction is greater than a length of the second leg in the second direction, or a length of the third leg in the second direction is greater than the length of the second leg in the second direction.

13. The semiconductor device as claimed in claim 10, wherein the first active region and the conductive metal structure define a first transistor, the second active region and the conductive metal structure define a second transistor, the first transistor and the second transistor serving as a first inverter.

14. The semiconductor device as claimed in claim 13, wherein the second active region and the conductive metal structure further define a third transistor, and the third active region and the conductive metal structure define a fourth transistor, the third transistor and the fourth transistor serving a second inverter.

15. The semiconductor device as claimed in claim 14, wherein inputs of the first inverter and the second inverter are coupled to each other.

16. A method of designing a layout of a semiconductor device, the method comprising:
providing a substrate
defining a first active region of the substrate on the substrate;
defining a second active region of the substrate on the substrate separate from the first active region; and
arranging a conductive metal structure to connect the first active region and the second active region, the conductive metal structure including a first leg of the conductive metal structure, a second leg of the conductive metal structure separate from the first leg and a body of the conductive metal structure extending between and connecting the first leg and the second leg, wherein the first leg, the second leg and the body are in the same semiconductor layer;
assigning a leg width in a first direction to the first leg;
assigning a body width in a second direction different from the first direction to the body;
adjusting the leg width and the body width until the body width is greater than the leg width; and
forming the conductive metal structure on the substrate based on the adjusted leg width and the adjusted body width.

17. The method as claimed in claim 16, further including:
extending each of the first leg and the second leg to connect the first active region and the second active region.

18. The method as claimed in claim 17, further including:
arranging a first device at the first leg between the body and the second active region.

19. The method as claimed in claim 18, further including:

assigning a first distance between the body and the first device;

obtaining information on a threshold distance between the body and the first device; and adjusting the first distance until the adjusted first distance is smaller than the threshold distance.

20. The method as claimed in claim 19, wherein the threshold distance has a range of 0 nm to 100 nm.

* * * * *